(12) United States Patent
Kabakci

(10) Patent No.: US 12,531,550 B1
(45) Date of Patent: Jan. 20, 2026

(54) ELECTROHYDRAULIC SHOCKWAVE GENERATOR

(71) Applicant: Cengiz Kabakci, Largo, FL (US)

(72) Inventor: Cengiz Kabakci, Largo, FL (US)

( * ) Notice: Subject to any disclaimer, the term of this patent is extended or adjusted under 35 U.S.C. 154(b) by 0 days.

(21) Appl. No.: 19/330,931

(22) Filed: Sep. 17, 2025

(51) Int. Cl.
*H03K 3/57* (2006.01)
*H03K 3/013* (2006.01)

(52) U.S. Cl.
CPC .............. *H03K 3/57* (2013.01); *H03K 3/013* (2013.01)

(58) Field of Classification Search
CPC ................................. H03K 3/57; H03K 3/013
See application file for complete search history.

(56) References Cited

U.S. PATENT DOCUMENTS

| | | | | |
|---|---|---|---|---|
| 3,218,484 | A * | 11/1965 | Matusche | B21D 26/14 |
| | | | | 307/104 |
| 3,902,499 | A * | 9/1975 | Shene | G10K 15/06 |
| | | | | 606/128 |
| 4,674,505 | A * | 6/1987 | Pauli | G10K 9/12 |
| | | | | 601/4 |
| 5,419,327 | A * | 5/1995 | Rohwedder | A61B 17/2256 |
| | | | | 601/4 |
| 5,435,304 | A * | 7/1995 | Oppelt | A61B 8/0833 |
| | | | | 601/4 |
| 12,220,141 | B2 * | 2/2025 | Ullmann | A61B 17/2202 |
| 12,256,952 | B2 * | 3/2025 | Jiménez González | A61B 17/225 |
| 2008/0281199 | A1 * | 11/2008 | DeBrock | A61B 17/2256 |
| | | | | 600/439 |
| 2011/0028868 | A1 * | 2/2011 | Spector | A61B 17/225 |
| | | | | 601/4 |
| 2011/0208206 | A1 * | 8/2011 | Diamant | A61B 17/2202 |
| | | | | 606/128 |
| 2013/0046210 | A1 * | 2/2013 | Zhong | A61B 17/225 |
| | | | | 601/4 |
| 2022/0163287 | A1 * | 5/2022 | Ladyagin | F41B 15/04 |
| 2023/0346407 | A1 * | 11/2023 | Jiménez González | B06B 1/0215 |
| 2024/0197343 | A1 * | 6/2024 | Hinding | A61B 17/22004 |
| 2025/0000532 | A1 * | 1/2025 | Ullmann | A61B 17/22022 |
| 2025/0169836 | A1 * | 5/2025 | Ullmann | A61B 17/2202 |

* cited by examiner

*Primary Examiner* — Rexford N Barnie
*Assistant Examiner* — Michael J Warmflash
(74) *Attorney, Agent, or Firm* — Distinct Patent Law; Justin P. Miller

(57) ABSTRACT

An electrohydraulic shock wave generator includes a capacitor configured to store electrical energy and a discharge circuit configured to discharge the capacitor through an electrode assembly positioned in an electrically conductive medium to generate shock waves. A diode suppression network is positioned within the discharge circuit and configured to prevent reverse voltage transients and suppress discharge oscillations. The diode suppression network converts underdamped oscillatory discharge into critically damped discharge waveform to produce shock waves having narrow pulse widths. The generator may include low-resistance discharge circuits with conductors having greater cross-sectional areas and total circuit resistance of less than 0.025 ohms. The capacitor may have a capacitance of 25 nanofarads or less and store electrical energy at voltages between 15 kilovolts and 60 kilovolts. The critically-damped discharge waveform produces shock waves having rapid rise times that minimize activation of pain-sensing nerve fibers during therapeutic treatment.

14 Claims, 5 Drawing Sheets

ELECTROHYDRAULIC SHOCKWAVE GENERATOR

FIELD

This invention relates to electrohydraulic shock wave generators for medical therapy, and more particularly to improved circuit configurations for generating shock waves with optimized electrical discharge characteristics.

BACKGROUND

Electrohydraulic shock wave generators have been used in medical applications for decades, particularly in extracorporeal shock wave lithotripsy (ESWL) for treating kidney stones and extracorporeal shock wave therapy (ESWT) for treating musculoskeletal disorders. These devices generate shock waves by creating high-voltage electrical discharges between electrodes positioned in a liquid medium, typically water or saline solution.

Existing electrohydraulic shock wave generators suffer from technical limitations that affect both therapeutic efficacy and patient comfort. The result of these technical limitations is slow rise times in pulse generation, which reduces the effectiveness of the therapy for multiple reasons. First, the gradual pressure buildup activates low-frequency mechanoreceptors and nociceptors in patient tissue, contributing to patient discomfort and pain during treatment. Second, the broad pulse width results in prolonged mechanical stimulation that reduces therapeutic efficiency by failing to optimize cellular mechanotransduction pathways.

Furthermore, conventional electrohydraulic generators often exhibit underdamped discharge characteristics, leading to oscillatory current flow that can cause pulse broadening and mechanical ringing. This oscillatory behavior reduces the sharpness of the mechanical pulse and contributes to electrode erosion and inconsistent shock wave generation.

What is needed is an electrohydraulic shock wave generator that produces shock waves with rapid rise times and narrow pulse widths to minimize patient discomfort while maximizing therapeutic efficacy through optimized cellular mechanotransduction. The generator should incorporate circuit design features that suppress discharge oscillations and negative voltage transients while maintaining consistent shock wave characteristics.

SUMMARY

The electrohydraulic shock wave generator featuring negative voltage suppression and optimized discharge dynamics addresses the limitations of current ESWT systems by integrating several key technical innovations to reduce patient pain while enhancing therapeutic efficacy.

The generator employs a high-voltage, low-capacitance discharge system that stores electrical energy in a capacitor with a capacitance value in the nanofarads range or less while operating at voltages between 15 and 60 kilovolts. This configuration enables rapid energy release with significantly shorter discharge time constants compared to conventional systems.

The rapid rise and fall times of the generated pulses provide significant therapeutic advantages by exploiting the time-based limitations of human pain perception. As background, pain signals are transmitted through two primary neural pathways: fast-conducting Aδ-fibers and slow-conducting C-fibers. Aδ-fibers conduct at velocities of 12-30 meters per second and respond to sharp, mechanical stimuli, while C-fibers conduct at 0.5-2 meters per second and respond to prolonged stimulation. The improved shock wave generator produces shock wave pulses with rise times measured in nanoseconds—orders of magnitude faster than the temporal resolution of these pain-conducting neural pathways and thus unable to be perceived by the Aδ-fibers or the C-fibers.

In comparison, conventional electrohydraulic systems generate pulses with slow rise times. The result is ample time for pain receptors to activate and transmit signals to the central nervous system. The prolonged mechanical stimulation from slow pulses enables temporal summation within nociceptive pathways, where multiple sub-threshold stimuli combine to exceed the pain threshold.

In contrast, the rapid rise and fall times of the improved generator create mechanical stimulation that occurs faster than the integration time constants of pain receptors, effectively bypassing the temporal summation mechanism that contributes to patient discomfort.

To accomplish this rapid rise time and narrow pulse width, multiple technical features are present within the electrohydraulic shock wave generator featuring negative voltage suppression and optimized discharge dynamics.

For example, a low-resistance discharge circuit utilizes conductors having increased cross-sectional area relative to conventional wiring, thereby substantially reducing circuit resistance. The discharge path includes a shielded return conductor that maintains signal integrity and minimizes electromagnetic interference during the high-energy discharge process.

Additionally, a diode suppression network prevents reverse voltage transients and suppresses discharge oscillations that would otherwise broaden the mechanical pulse. The diodes convert the naturally underdamped oscillatory discharge into a critically-damped waveform, producing narrow pulse widths that minimize activation of pain-sensing nerve fibers.

The electrode discharge gap contains an electrically conductive liquid medium engineered to maintain consistent breakdown voltage characteristics. This design ensures repeatable discharge behavior and consistent therapeutic output across multiple treatment pulses.

The optimized discharge dynamics produce mechanical shock waves with rapid pressure gradients (dP/dt) that create high strain rates in biological tissues. These enhanced strain rates activate mechanotransduction pathways more effectively than conventional systems, improving therapeutic outcomes through increased cellular response to mechanical stimulation.

Expanding on the operational characteristics of the circuit, the equation $\tau = R \times C$ defines the time constant of the Resistor-Capacitor (RC) circuit.

$\tau$ (tau) is the time constant, measured in seconds. It represents the characteristic time required for the capacitor in the circuit to either charge or discharge.

R_total is the total resistance in the circuit path, measured in Ohms ($\Omega$). It is the sum of all resistances in the discharge path, including the resistance of the wires, the switch, and the fluid gap itself.

C is the capacitance of the capacitor, measured in Farads (F). It is a measure of how much electrical energy the capacitor can store.

By minimizing C and R_total, $\tau$ is reduced, resulting in a shockwave with a very rapid rise time—a shockwave that is more effective and less painful.

Applying the equations to the electrohydraulic shock wave generator featuring negative voltage suppression and optimized discharge dynamics, the circuit uses a capacitor of 25 nF or less—much smaller than the 200 nF used in prior art.

The use of low-resistance specific AWG wiring, as compared to the traditional AWG wire of the prior art, lowers the total resistance, further decreasing $\tau$.

The result is a much smaller t value, in the range of 1-10 ns, as compared to prior art values of ~213 ns.

For example, where a conventional system might operate with a 200 nanofarad capacitor at 7 kilovolts through traditional AWG conductors, resulting in a discharge time constant of approximately 213 nanoseconds, the present generator achieves a discharge time constant of approximately 10 nanoseconds through its low-capacitance, low-resistance design. This 20-fold improvement in discharge speed directly translates to faster rise times and narrower pulse widths.

The integration of these technical features creates a synergistic effect where the rapid, well-damped discharge produces therapeutic shock waves that maintain clinical efficacy while substantially reducing patient pain perception during treatment.

A table simplifies the comparison:

| Parameter | Prior Art Devices | Present Invention |
|---|---|---|
| Voltage (V) | Less than 10 kV | 15,000-60,000 kV |
| Capacitance (C) | 0.2 µF (200 nF) | Less than 25 nFs |
| Cable Gauge | Standard gauge wiring | Increased cross-sectional area wiring for low resistance |
| Cable Resistance (3 m) | ~above 60 mΩ | ~below 20 mΩ |
| Total Circuit Resistance ($R_{total}$) | ~Greater than 0.08 Ω | ~Less than 0.04 Ω |
| Diodes/Negative Voltage Suppression | None | High-voltage diode network |
| Discharge Time Constant ($\tau$) | ~Above 200 ns | ~Below 10 ns |
| Rise Time ($T_r$) | Slow | Fast |
| Pulse Width ($\Delta t$) | Broad | Narrow |
| Pulse Shape | Underdamped, oscillatory | Critically damped, non-oscillatory |
| Pain Reduction Design | Not addressed | Engineered to minimize nociceptor activation and patient pain |
| Therapeutic Efficiency | Limited strain rate, low mechanotransduction | High strain rate, enhanced mechanotransduction |

Turning to the circuit layout, its structure integrates the key components in a specific arrangement to achieve optimal discharge characteristics. A high-voltage energy source provides charging power through positive and negative leads to the energy storage capacitor. A charging resistor limits inrush current during the capacitor charging process, while a discharge resistor provides controlled energy release path.

The capacitor connects to a triggered discharge switch, which may be implemented as a spark gap or high-voltage semiconductor switch. Upon triggering, stored energy flows through low-resistance discharge wiring to the electrode assembly. The positive electrode and negative electrode are positioned within a saline discharge gap that serves as the electrically conductive medium for shock wave generation. Saline is the preferred fluid medium for placement of the electrodes, but other fluid mediums are anticipated.

High-voltage diodes are strategically positioned within the circuit to suppress negative voltage transients and prevent reverse current flow. The positive line suppression diode prevents voltage spikes on the charging side, while an optional negative diode provides additional suppression on the return path. These diodes work together to convert the naturally underdamped discharge into a critically-damped waveform.

A shielded return conductor completes the circuit while maintaining signal integrity and minimizing electromagnetic interference. The shielding prevents external interference from affecting the discharge waveform and contains electromagnetic emissions generated during the high-energy discharge process.

This circuit arrangement ensures that the high-voltage, low-capacitance energy storage combines with the low-resistance discharge path and diode suppression network to produce the desired rapid, controlled energy release that generates therapeutic shock waves with optimal pulse characteristics.

BRIEF DESCRIPTION OF THE DRAWINGS

The invention can be best understood by those having ordinary skill in the art by reference to the following detailed description when considered in conjunction with the accompanying drawings in which.

DETAILED DESCRIPTION

Figure 1:
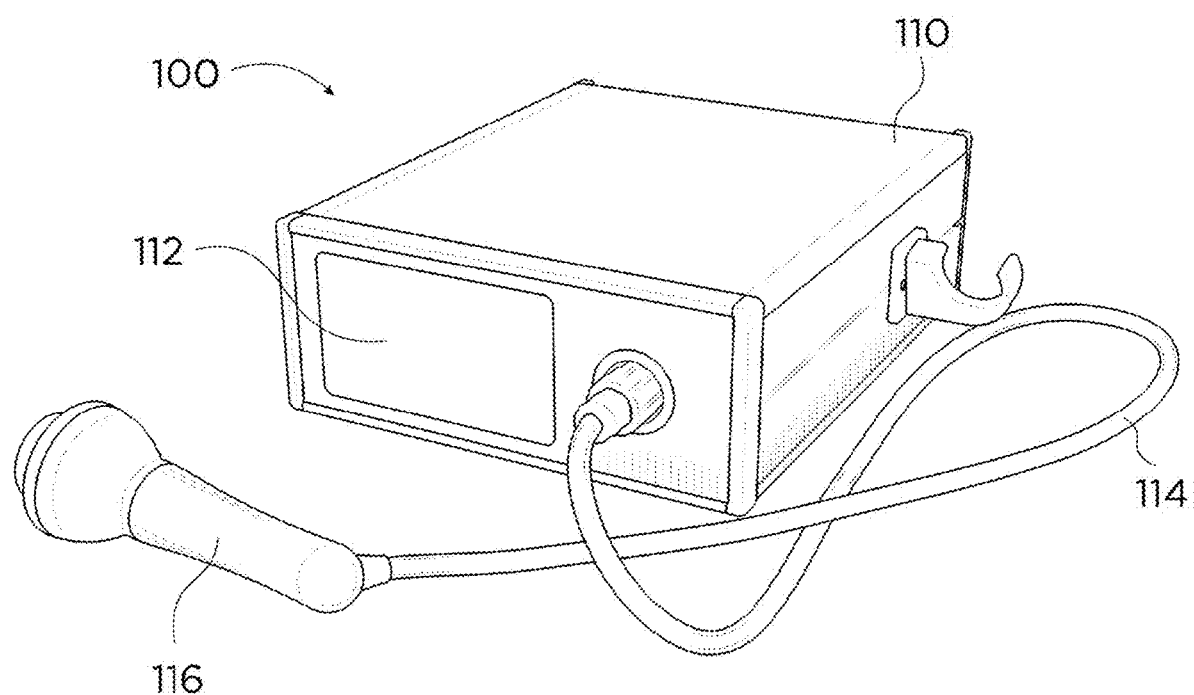
FIG. 1 illustrates a first view of the electrohydraulic shockwave generator with improved circuit.

Reference will now be made in detail to the presently preferred embodiments of the invention, examples of which are illustrated in the accompanying drawings. Throughout the following detailed description, the same reference numerals refer to the same elements in all figures.

Referring to FIG. 1, a first view of the electrohydraulic shockwave generator with improved circuit is shown.

The electrohydraulic shockwave generator with improved circuit 100 is shown with control unit 110 with display 112. Cable 114 extends from the control unit 110, connecting to the handpiece 116.

Figure 2:
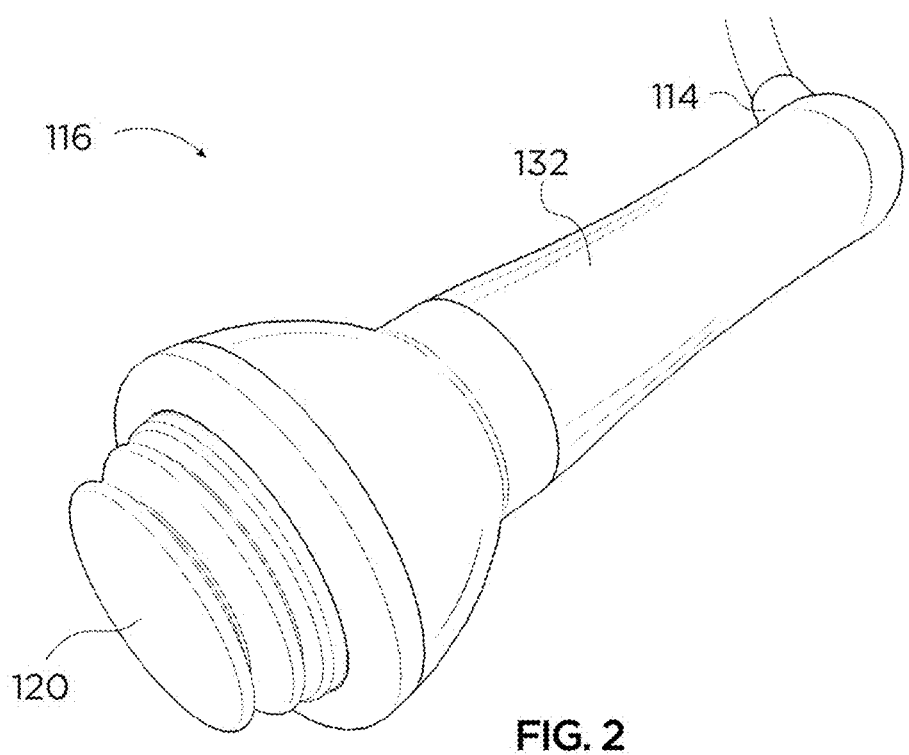
FIG. 2 illustrates a view of the handpiece of the electrohydraulic shockwave generator with improved circuit.

Referring to FIG. 2, a view of the handpiece of the electrohydraulic shockwave generator with improved circuit is shown.

The handpiece 116 is connected to cable 114. The handpiece 116 includes the handle 132 with membrane 120 at one end.

Figure 3:
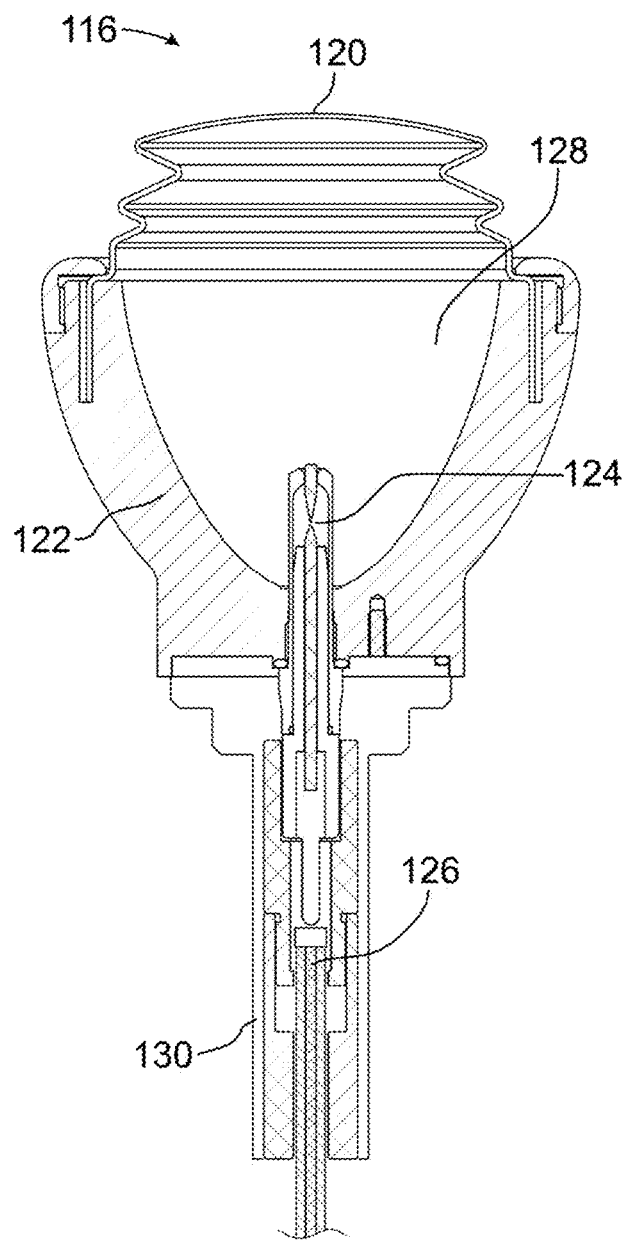
FIG. 3 illustrates a cross-sectional view of the handpiece of the electrohydraulic shockwave generator with improved circuit.

Referring to FIG. 3, a cross-sectional view of the handpiece of the electrohydraulic shockwave generator with improved circuit is shown.

During operation, a spark is generated between the two tips of the electrode 124. A plasma channel or plasma bubble is created in the discharge gap. This plasma expansion and collapse produces a pressure wave that propagates through the fluid 128, passing through the membrane 120 and into the patient.

Further shown as components of the handpiece 116 are the reflector 122, power cable 126, and housing 130.

Figure 4:
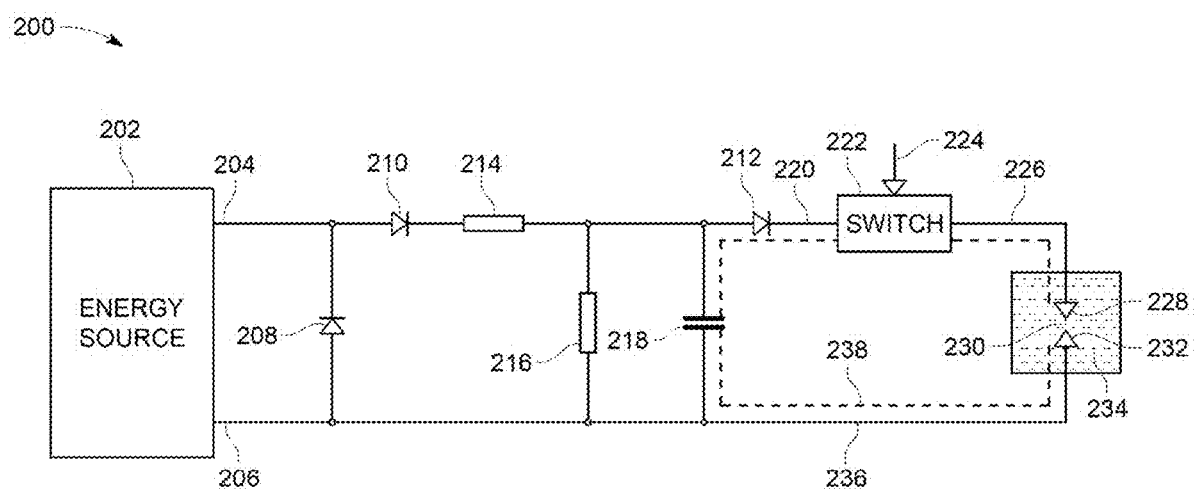
FIG. 4 illustrates a schematic of the circuit of the electrohydraulic shockwave generator with improved circuit.

Referring to FIG. 4, a schematic of the circuit of the electrohydraulic shockwave generator with improved circuit is shown.

The electrode circuit 200 is powered by a high-voltage energy source 202, which has a high-voltage energy source positive lead 204 and a high-voltage energy source negative lead 206. The high-voltage energy source negative lead 206 serves as the common ground for the circuit.

A first high-voltage diode 208 is connected in a reverse-bias configuration across the high-voltage energy source 202 for protection—its cathode is connected to the high-voltage energy source positive lead 204 and its anode is connected to the high-voltage energy source negative lead 206.

The charging portion of the electrode circuit 200 is designed to charge a capacitor 218. The high-voltage energy source positive lead 204 is connected to the anode of a second high-voltage diode 210. The cathode of the second high-voltage diode 210 is connected in series with a first terminal of a charging resistor 214. The second terminal of the charging resistor 214 is connected to a node that joins the positive terminal of the capacitor 218 and the anode of a third high-voltage diode 212. The negative terminal of the capacitor 218 is connected to the high-voltage energy source negative lead 206. A discharge resistor 216 is connected in parallel with the capacitor 218, with one end connected to the positive terminal of the capacitor 218 and the other end connected to the high-voltage energy source negative lead 206.

In operation, the high-voltage energy source 202 supplies a current that flows through the high-voltage energy source positive lead 204, the second high-voltage diode 210, and the charging resistor 214 to charge the capacitor 218. The second high-voltage diode 210 prevents the capacitor 218 from discharging back into the high-voltage energy source 202. The discharge resistor 216 provides a path for the capacitor 218 to safely discharge when the high-voltage energy source 202 is deactivated.

The discharge portion of the circuit facilitates the rapid release of energy stored in the capacitor 218 across a fluid discharge gap 230. The anode of the third high-voltage diode 212 is connected to the positive terminal of the capacitor 218. The cathode of the third high-voltage diode 212 is connected via low-resistance discharge wiring 220 to the input terminal of a switch 222. The switch 222 is controlled by a switch trigger input 224. The output terminal of the switch 222 is connected via an electrode hot line 226 to a positive electrode 228.

The positive electrode 228 is positioned opposite a negative electrode 232 within a fluid 234, creating the fluid discharge gap 230 between them. The negative electrode 232 is connected via a shielded return conductor 236 back to the high-voltage energy source negative lead 206, thereby completing the circuit to the negative terminal of the capacitor 218.

When the switch 222 is activated by the switch trigger input 224, the discharge path is closed. The energy stored in the capacitor 218 is rapidly discharged, creating a high-energy electrode current 238 that flows through the third high-voltage diode 212, low-resistance discharge wiring 220, switch 222, electrode hot line 226, positive electrode 228, across the fluid discharge gap 230 to the negative electrode 232, and back to the capacitor's negative terminal through the shielded return conductor 236.

Figure 5:
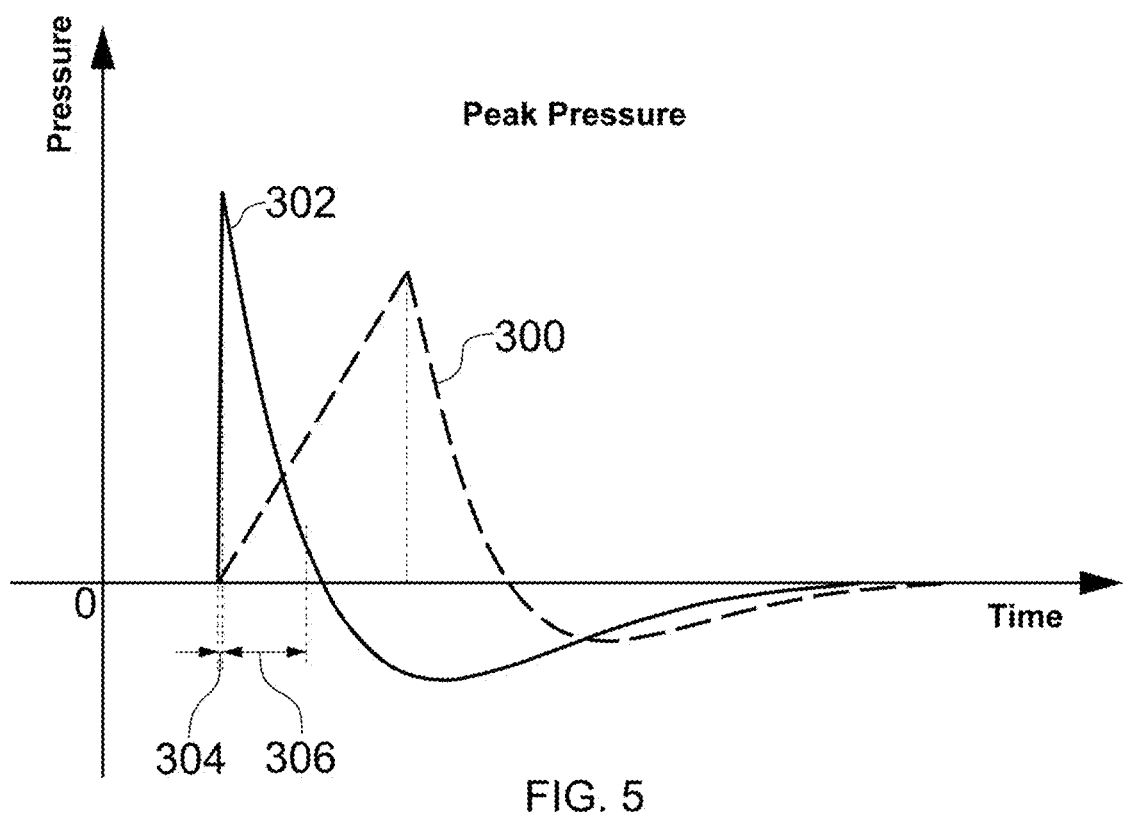
FIG. 5 illustrates a graph of waveforms of the electrohydraulic shockwave generator with improved circuit.

Referring to FIG. 5, a graph of waveforms of the electrohydraulic shockwave generator with improved circuit is shown.

FIG. 5 shows a graph plotting pressure versus time for electrohydraulic shock wave generator output pulses. The graph compares two distinct waveforms: a prior art pulse 300 and an improved pulse 302.

The prior art pulse 300 exhibits a gradual pressure rise and extended duration characteristics typical of conventional electrohydraulic systems. In contrast, the improved pulse 302 demonstrates a faster rise 304 that achieves peak pressure in substantially less time than the prior art pulse 300.

Both pulses terminate with a long tail 306, representing the decay portion of the pulse. But the improved pulse 302 reaches its peak pressure more rapidly due to the faster rise 304, which results from the optimized discharge dynamics of the improved circuit configuration.

The faster rise acoustic front 304 of the improved pulse 302 provides therapeutic advantages by creating mechanical stimulation that occurs faster than the temporal resolution of pain-conducting neural pathways, thereby reducing patient discomfort while maintaining therapeutic efficacy through enhanced cellular mechanotransduction.

Equivalent elements can be substituted for the ones set forth above such that they perform in substantially the same manner in substantially the same way for achieving substantially the same result.

What is claimed is:

1. An electrohydraulic shock wave generator comprising:
   a high-voltage energy source;
   a capacitor configured to store electrical energy;
   a discharge circuit configured to discharge the capacitor through an electrode assembly with an electrode discharge gap positioned in an electrically conductive medium to generate shock waves;
   a diode suppression network positioned within the discharge circuit and configured to prevent reverse voltage transients and suppress discharge oscillations;
   wherein the diode suppression network converts an underdamped oscillatory discharge into a critically-damped discharge waveform to produce shock waves having narrow pulse widths; and the diode suppression network comprises three high-voltage diodes including: a first high-voltage diode connected in reverse-bias configuration across the high-voltage energy source with a cathode connected to a positive lead and an anode connected to a negative lead of the high-voltage energy source; a second high-voltage diode positioned in a charging path between the high-voltage energy source and the capacitor and configured to prevent discharge of capacitor back to the high-voltage energy source; and a third high-voltage diode positioned in the discharge circuit between the capacitor and the electrode discharge gap and configured to prevent reverse current flow and suppress voltage oscillations during discharge.

2. The electrohydraulic shock wave generator of claim 1, further comprising:
   a charging resistor positioned in series between high-voltage energy source and the capacitor and configured to limit inrush current during capacitor charging; and
   a discharge resistor connected in parallel with the capacitor with one terminal connected to a positive terminal of the capacitor and another terminal connected to a negative terminal of the capacitor;
   wherein the discharge resistor provides a controlled energy release path when the high-voltage energy source is deactivated.

3. The electrohydraulic shock wave generator of claim 1, wherein the capacitor is configured to store electrical energy at voltages between 20 kilovolts and 50 kilovolts.

4. The electrohydraulic shock wave generator of claim 1, further comprising a shielded return conductor configured to provide a return path for discharge current while minimizing electromagnetic interference.

5. The electrohydraulic shock wave generator of claim 1, wherein the critically-damped discharge waveform produces shock waves having a discharge time constant of approximately 10 nanoseconds or less.

6. An electrode circuit for an electrohydraulic shockwave generator, the electrode circuit comprising:
   a high-voltage energy source having a positive lead and a negative lead;
   a capacitor having a positive terminal and a negative terminal, wherein the negative terminal is electrically connected to the negative lead of the high-voltage energy source;
   a charging path a first high-voltage diode connected in a reverse-bias configuration across the high-voltage energy source, with a cathode of the first high-voltage diode connected to the positive lead and an anode of the first high-voltage diode connected to the negative lead electrically connecting the positive lead of the high-voltage energy source to the positive terminal of the capacitor, the charging path including a second high-voltage diode configured to prevent current flow from the capacitor to the high-voltage energy source;
   a discharge path configured to discharge the capacitor across a fluid discharge gap, the discharge path comprising, in series:
      a third high-voltage diode having an anode connected to the positive terminal of the capacitor;
      a switch electrically connected to a cathode of the third high-voltage diode; and
      a positive electrode electrically connected to the switch, wherein the third high-voltage diode is configured to prevent reverse current flow and suppress voltage oscillations during a discharge event.

7. The electrode circuit of claim 6, wherein the capacitor has a capacitance of 25 nanofarads or less.

8. The electrode circuit of claim 6, wherein the discharge path further comprises low-resistance discharge wiring.

9. The electrode circuit of claim 6, further comprising a shielded return conductor electrically connecting a negative electrode of the fluid discharge gap to the negative lead of the high-voltage energy source.

10. The electrode circuit of claim 6, wherein the charging path further comprises a charging resistor connected in series between the second high-voltage diode and the capacitor.

11. The electrode circuit of claim 6, further comprising a discharge resistor connected in parallel with the capacitor, configured to provide a passive discharge path for the capacitor.

12. The electrode circuit of claim 6, wherein the third high-voltage diode in the discharge path converts a naturally underdamped discharge waveform into a critically-damped discharge waveform.

13. An electrohydraulic shock wave generator comprising:
   a high-voltage energy storage system including at least one capacitor having a capacitance of 25 nanofarads or less and configured to store electrical energy at voltages between 15 kilovolts and 60 kilovolts;
   a discharge circuit having a total circuit resistance of less than 0.04 ohms, wherein the discharge circuit connects the high-voltage energy storage system to an electrode discharge gap;
   a diode suppression network positioned within the discharge circuit and configured to prevent reverse voltage transients and suppress discharge oscillations to produce critically damped discharge waveforms;
   an electrode discharge the diode suppression network comprises three high-voltage diodes including: a first high-voltage diode connected in reverse-bias configuration across the high-voltage energy storage system with a cathode connected to a positive lead and an anode connected to a negative lead of the high-voltage energy storage system; a second high-voltage diode positioned in a charging path between the high-voltage energy storage system and the at least one capacitor and configured to prevent discharge of the at least one capacitor back to the high-voltage energy storage system; and a third high-voltage diode positioned in the discharge circuit between the at least one capacitor and the electrode discharge gap and configured to prevent reverse current flow and suppress voltage oscillations during discharge gap containing an electrically conductive liquid medium and configured to generate shock waves upon electrical discharge;
   a shielded return conductor providing a return path for discharge current while minimizing electromagnetic interference;
   wherein a combination of the high-voltage energy storage system, low-resistance discharge circuit, and diode suppression network produces shock waves having rapid pressure gradients and narrow pulse widths that enhance cellular mechanotransduction while reducing nociceptor activation compared to conventional electrohydraulic shock wave generators.

14. The electrohydraulic shock wave generator of claim 13, further comprising:
   a charging resistor positioned in series between the high-voltage energy storage system and the at least one capacitor and configured to limit inrush current during capacitor charging; and
   a discharge resistor connected in parallel with the at least one capacitor with one terminal connected to a positive terminal of the at least one capacitor and another terminal connected to a negative terminal of the at least one capacitor;
   wherein the discharge resistor provides a controlled energy release path when the high-voltage energy storage system is deactivated.

* * * * *